United States Patent
Tuominen

(10) Patent No.: US 11,211,317 B2
(45) Date of Patent: Dec. 28, 2021

(54) COMPONENT CARRIER COMPRISING A COMPONENT HAVING VERTICAL THROUGH CONNECTION

(71) Applicant: AT&S Austria Technologie & Systemtechnik Aktiengesellschaft, Leoben (AT)

(72) Inventor: Mikael Tuominen, Pernio (FI)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 0 days.

(21) Appl. No.: 16/806,841

(22) Filed: Mar. 2, 2020

(65) Prior Publication Data
US 2020/0294900 A1 Sep. 17, 2020

(30) Foreign Application Priority Data
Mar. 11, 2019 (CN) .................. 201910182054.7

(51) Int. Cl.
| H01L 23/498 | (2006.01) |
| H01L 21/48 | (2006.01) |
| H01L 21/768 | (2006.01) |
| H01L 23/48 | (2006.01) |
| H01L 23/367 | (2006.01) |
| H01L 23/538 | (2006.01) |

(52) U.S. Cl.
CPC ...... H01L 23/49827 (2013.01); H01L 21/486 (2013.01); H01L 21/76898 (2013.01); H01L 23/481 (2013.01)

(58) Field of Classification Search
CPC ............. H01L 21/486; H01L 21/76898; H01L 23/49827; H01L 23/481
See application file for complete search history.

(56) References Cited

U.S. PATENT DOCUMENTS

| 3,881,971 | A | * | 5/1975 | Greer | .................... H01L 23/485 |
| | | | | | 438/625 |
| 2004/0183192 | A1 | | 9/2004 | Otsuka et al. | |
| 2010/0032827 | A1 | | 2/2010 | Hsu | |
| 2012/0273960 | A1 | | 11/2012 | Park et al. | |

(Continued)

FOREIGN PATENT DOCUMENTS

| JP | 5617846 | 11/2014 |
| KR | 20120137201 A | 12/2012 |

(Continued)

OTHER PUBLICATIONS

Manook, R.; Office Action in EP Patent Application 20160467.5; pp. 1-20; dated Apr. 16, 2020, European Patent Office, 80298, Munich, Germany.

(Continued)

*Primary Examiner* — Herve-Louis Y Assouman
(74) *Attorney, Agent, or Firm* — Robert A. Blaha; Smith Tempel Blaha LLC

(57) ABSTRACT

A component carrier and a method of manufacturing the same are disclosed. The component carrier includes a stack having at least one electrically conductive layer structure and/or at least one electrically insulating layer structure, a component embedded in the stack, and at least one vertical through connection extending between two opposing main surfaces of and through the component.

11 Claims, 2 Drawing Sheets

(56) References Cited

U.S. PATENT DOCUMENTS

| | | | |
|---|---|---|---|
| 2012/0286419 A1 | 11/2012 | Kwon et al. | |
| 2013/0009325 A1 | 1/2013 | Mori et al. | |
| 2013/0058067 A1* | 3/2013 | Yee | H01L 23/49827 361/820 |
| 2013/0075924 A1* | 3/2013 | Lin | H01L 23/293 257/774 |
| 2014/0102772 A1 | 4/2014 | Chen et al. | |
| 2018/0288879 A1* | 10/2018 | Tuominen | H01L 24/20 |

FOREIGN PATENT DOCUMENTS

| | | |
|---|---|---|
| TW | 201209973 A | 3/2012 |
| WO | WO 2013/101849 A1 | 7/2013 |

OTHER PUBLICATIONS

Manook, R.; Extended European Search Report in EP Patent Application 20160467.5; pp. 1-27; dated Jul. 7, 2020, European Patent Office, 80298, Munich, Germany.

\* cited by examiner

COMPONENT CARRIER COMPRISING A COMPONENT HAVING VERTICAL THROUGH CONNECTION

CROSS-REFERENCE TO RELATED APPLICATION

This application claims the benefit of the filing date of the Chinese patent application no. 201910182054.7.X filed on Mar. 11, 2019, which is incorporated herein by reference in its entirety.

TECHNICAL FIELD

Embodiments of the invention relate to a component carrier with a component having a vertical through connection, and to a method of manufacturing the component carrier.

TECHNOLOGICAL BACKGROUND

FIG. 2 illustrates a cross-sectional view of a component carrier 100 according to a prior art. The component carrier 100 comprises a stack 20 having an electrically conductive layer structure 70 and an electrically insulating layer structure 40. The electrically conductive layer structure 70 includes vias which extend through the electrically insulating layer structure 40. A component 60 is embedded in the stack 20. In particular, in 3D packaging applications, where many components are integrated both horizontally and vertically in two or more electrically insulating layers, i.e. they are connected to form a three-dimensional integrated circuit, there is a basic problem of connecting embedded packages from a top to a bottom side of the package. In a standard ECP (Embedded Component Packaging) packaging model, the connections must be routed out from dense signal areas of the component and then routed further back up to the other side of the package. However, the density in such a component carrier can still be enhanced.

SUMMARY

There may be a need to provide a component carrier and a method of manufacturing the same, by which a density in the component carrier can be enhanced.

This need is fulfilled by a component and a method of manufacturing the same according to the independent claims.

According to an exemplary embodiment of the invention, a component carrier is provided. The component carrier comprises a stack having at least one electrically conductive layer structure and/or at least one electrically insulating layer structure, a component embedded in the stack, and at least one vertical through connection extending between two opposing main surfaces of and through the component. The vertical through connection can be a so-called through silicon via (TSV).

According to another exemplary embodiment of the invention, a method of manufacturing a component carrier is provided. The method comprises forming a stack comprising at least one electrically conductive layer structure and/or at least one electrically insulating layer structure, embedding a component in the stack, and forming at least one vertical through connection extending between two opposing main surfaces of and through the component.

OVERVIEW OF EMBODIMENTS

A reduction on the density can be achieved on the main connection side of the component carrier. This advantage can further be enhanced, for example in an ECP (Embedded Component Packaging) package, by laser vias in the electrically insulating layer structure, i.e. by direct laser via stacking on top of the vertical through connections. Thereby, a direct incorporation of the connection to the overall packaging can be achieved. Thus, a new capability is offered by minimal investment.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in a particular epoxy-based build-up film or a photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

In an embodiment, the vertical through connection is connected to a first via in the least one electrically insulating layer structure arranged adjacent to a first main surface of the two opposing main surfaces of the component. The vertical through connection can further be connected to a second via in a second electrically insulating layer structure arranged adjacent to a second main surface of the component, the second main surface of the component being opposed to the first main surface of the component. The first and/or the second via can be a so called through mold via (TMV). Thereby, a complex component carrier can be manufactured under low costs.

In an embodiment, the vertical through connection is aligned to at least one of the first and second vias so that a connection through the entire component carrier can be formed. Alternatively, a blind hole can be formed if the vertical through connection is aligned only to first vias or only to second vias. It is possible that either the first vias or the second vias are omitted.

In an embodiment, contacts of the component carrier have a first pitch and contacts of the component have a second pitch, wherein the first pitch is substantially equal to the second pitch. Thereby, the component carrier may have the same dense pitch like the component.

In an embodiment, the component further comprises an active silicon layer at least on one of the two opposing main surfaces of the component. The active silicon layer can provide interconnections between vertical through connections and vias.

In an embodiment, a plurality of N vias is provided and the active silicon layer connects at least one vertical through connection to n vias, wherein n<N, and/or a plurality of M vertical through connections is provided and the active silicon layer connects at least one via to m vertical through connections, wherein m<M.

In an embodiment, the vertical through connection is connected at an upper end and/or at a lower end by at least one copper filled laser via, in particular an array of stacked copper filled laser vias. Thereby, a complex component carrier can be manufactured with low manufacturing costs. In an embodiment, the at least one copper filled laser via can have an axis which is shifted from an axis of the vertical through connection. In an embodiment, axes of interconnected, stacked copper filled laser vias can be shifted from each other in a staggered manner, in particular substantially in the same direction. For example, this can improve the stability of the component carrier by creating more stress reducing edges as well as by increasing a surface for heat spread. Advantageously, the staggering has the effect of increased stability and heat spread, while still keeping or establishing very dense lines and spaces and a low footprint.

Alternatively, instead of the laser vias, the vertical through connection can be contacted by direct contacting.

In an embodiment, the vertical through connection is an inlay. Thereby, a plating step can be omitted so that the manufacturing costs can be reduced. Furthermore, the inlay can improve the heat dissipation from the component.

In an embodiment, at least one vertical through connection is formed by etching, in particular by ion etching.

In an embodiment, the at least one vertical through connection is formed by at least one of mechanical drilling and laser drilling.

The vertical through connection and the vias can be formed by the same manufacturing technology and in the same manufacturing step.

In an embodiment, the component carrier further comprises at least one of the following features: the component is at least one of a semiconductor component and a silicon chip.

In an embodiment, the method comprises forming a first via in the least one electrically insulating layer structure arranged adjacent to one main surface of the two opposing main surfaces of the component, wherein the first via is connected to the vertical through connection. The method can further comprise forming a second via in a second electrically insulating layer structure arranged adjacent to a second main surface of the component, the second main surface of the component being opposed to the first main surface of the component, wherein the second via is connected to the vertical through connection.

In an embodiment, the method further comprises forming the vertical through connection to be aligned to at least one of the first and second vias so that a connection through the entire component carrier can be formed.

In an embodiment, the method further comprises arranging an active silicon layer at least on one of the two opposing main surfaces of the component.

In an embodiment of the method, a plurality of N vias is formed and the active silicon layer connects at least one vertical through connection to n vias, wherein n<N, and/or a plurality of M vertical through connections is formed and the active silicon layer connects at least one via to m vertical through connections, wherein m<M.

In an embodiment of the method, the vertical through connection is connected at an upper end and/or at a lower end by at least one copper filled laser via, in particular an array of stacked copper filled laser vias. The at least one copper filled laser via can have an axis which is shifted from an axis of the vertical through connection. Axes of interconnected, stacked, copper filled laser vias can be shifted from each other in a staggered manner, in particular substantially in the same direction.

Alternatively, instead of the laser vias, the vertical through connection can be contacted by direct contacting.

In an embodiment, the method further comprises arranging an inlay into the component to form the vertical through connection.

In an embodiment of the method, at least one vertical through connection is formed by etching, in particular by ion etching.

In an embodiment of the method, the at least one vertical through connection is formed by at least one of mechanical drilling and laser drilling.

It is conceivable that the vertical through connections and the first vias and/or the second vias are manufactured by the same technology, i.e. either by etching, laser drilling or mechanical drilling. Moreover, it is conceivable that the vertical through connections and the first vias and/or the second vias are then manufactured in the same manufacturing step. Thereby, the manufacturing process can be facilitated and the manufacturing costs of the component carrier are reduced.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
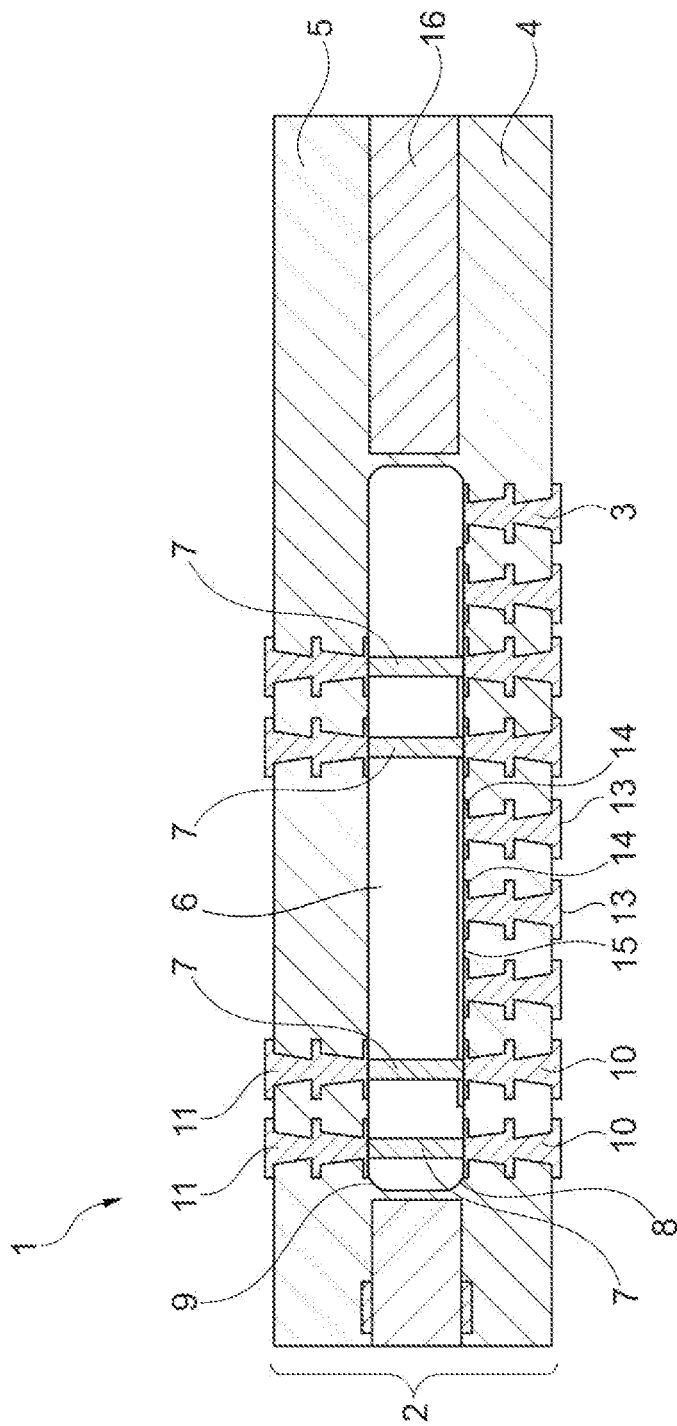
FIG. 1 illustrates a cross-sectional view of a component carrier according to an exemplary embodiment of the invention.
Figure 2:
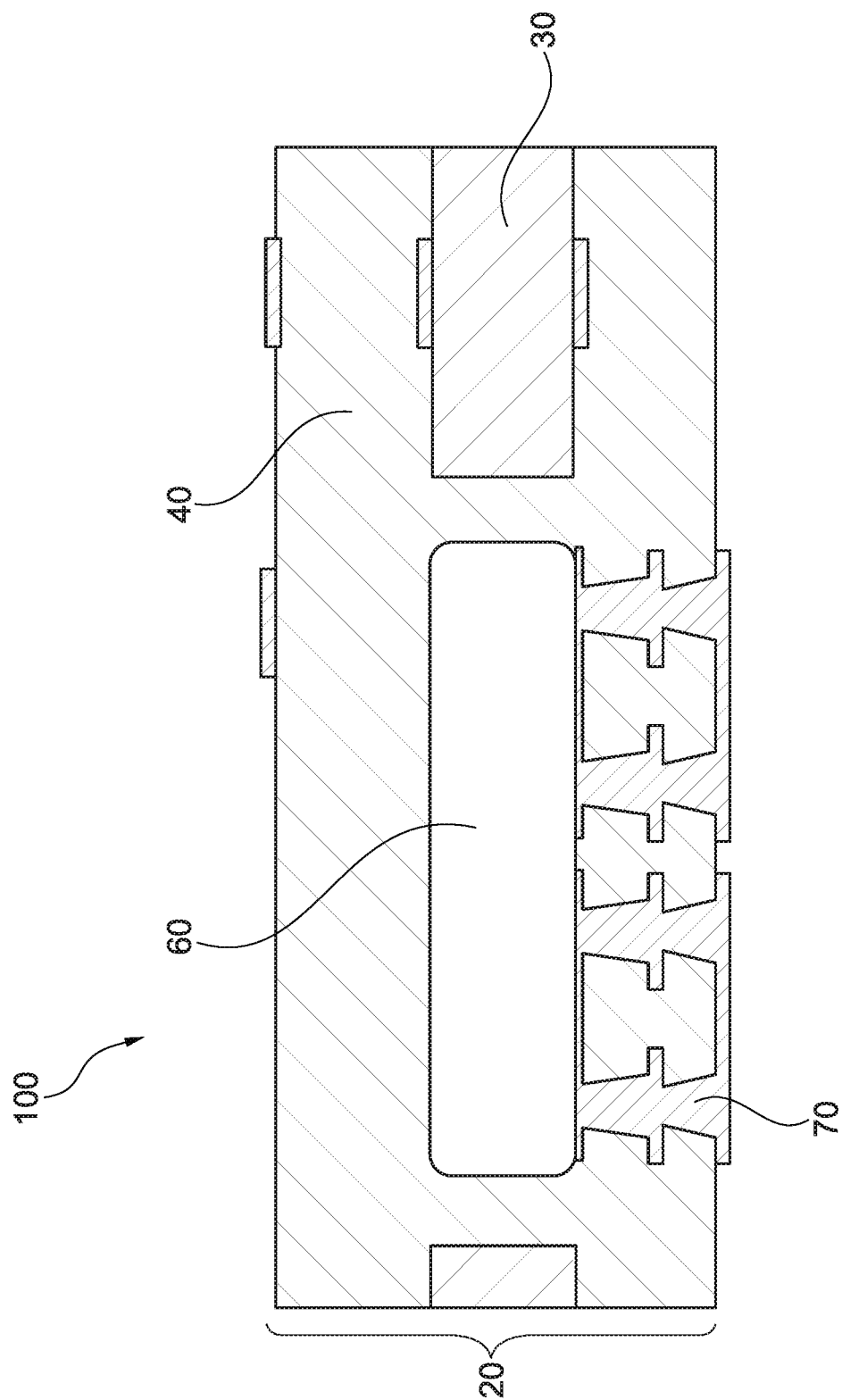
FIG. 2 illustrates a cross-sectional view of a component carrier according to a prior art.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment, a nano-coated structure may be used for component carrier technology, in particular as a dry-adhesive structure. An adhesive layer implementing such a surface configuration may also be denoted as gecko film. The adhesive effect of such a surface may be based on van der Waals forces. Descriptively speaking, a plurality of low dimensioned suction cups may be formed by such a concept. According to an exemplary embodiment of the invention, a reliable substrate and/or structured material is provided for embedding and/or surface mounting applications having specific adhesion properties due to a corresponding configuration of nano- and/or microstructures on this surface. Exemplary embodiments have the advantage that the mentioned adjustability of the surface adhesion properties may be obtained with low material consumption, low production costs, small contamination risk, and high process reliability.

In an embodiment, the mentioned materials may be used as support for component placement in embedding technologies. Compared to a traditional adhesive tape system that is depending on temperature and time, an exemplary embodiment uses the surface of a support (which may be rigid or flexible) or PCB elements (such as cores, prepregs, copper foils, etc.), that exhibit, thanks to the nano- and/or microstructures, van der Waals attraction forces, a gecko effect, a high grip, and that is dry and thus can be cleaned and reused. A sheet with nano- and/or microstructures can also be included in the final product. When used for an embedding concept, components may be placed on the dry surface and can be held in position by weak bonds (like van der Waals forces, gecko effect, high grip values) prior to the component lamination.

Such an architecture allows to obtain a dry interaction between the component and the holding substrate. No additional liquid adhesive is required. This has the advantages of a dry interaction, and a reduction of risk of contamination from the substrate.

FIG. 1 illustrates a cross-sectional view of a component carrier 1 according to an exemplary embodiment of the invention. The component carrier 1 is shaped as a plate. The component carrier 1 can be configured as one of the group consisting of a printed circuit board, a substrate, and an interposer. The component carrier 1 can be configured as a laminate-type component carrier.

The component carrier 1 comprises a stack 2 comprising electrically conductive layer structures 3 and electrically insulating layer structures 4, 5.

The electrically conductive layer structures 3 mainly comprise vias 10, 11 which are described later. The conductive layer structures 3 of the component carrier 1 may comprise at least one of the group consisting of copper, aluminum, nickel, silver, gold, palladium, and tungsten, any of the mentioned materials being optionally coated with supra-conductive material such as graphene.

The electrically insulating layer structures 4, 5 may comprise at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide.

A component 6 is embedded in the stack 2. The component 6 may be at least one of a semiconductor component and a silicon chip. The component 6 may be selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

A core 16 is provided in the electrically insulating layer structures 4, 5. The core 16 supports a heat transfer from the component 6 and avoids warpage of the component carrier 1.

In the component carrier 1, a plurality of vertical through connections 7 extends between two opposing main surfaces 8, 9 of and through the component 6. The vertical through connections 7 may be so called through-silicon vias (TSV). The vertical through connections 7 can comprise an electrically conductive or heat conductive material such as copper, aluminum, silver, gold, etc. The vertical through connections 7 can be solid or hollow such as a pipe. The vertical through connections 7 may have a function to conduct electricity and/or to conduct heat in order to achieve a heat transfer from the component 6.

The vertical through connections 7 are connected to vias 10, 11 in the insulating layer structures 4 which are arranged adjacent to the respective opposing main surfaces 8, 9 of the component 6. The vias 10, 11 may be so called through mold vias (TMV). In more detail, the vertical through connections 7 are connected to first vias 10 in a first electrically insulating layer structure 4 arranged adjacent to a first (bottom) main surface 8 of the component 6, and the vertical through connections 7 are connected to second vias 11 in a second electrically insulating layer structure 5 arranged adjacent to a second (upper) main surface 9 of the component 6, wherein the second main surface 9 of the component 6 is opposed to the first main surface 8 of the component 6. The core 16 is sandwiched between the first and second electrically insulating layer structures 4, 5.

The vertical through connections 7 are aligned to the first and second vias 10, 11 so that through connections through the entire component carrier 1 are formed. In more detail, the vertical through connections 7 together with the vias 10, 11 form a plurality of through connections between both opposing main surfaces of the component carrier 1.

The first and second vias 10, 11 can be copper filled laser vias 10, 11, in particular an array of stacked copper filled laser vias 10, 11. In other words, the vertical through connections 7 are connected at their upper ends and at their lower ends to the copper filled laser vias 10, 11, in particular an array of stacked copper filled laser vias 10, 11. The stacked copper filled laser vias 10, 11 extend through the stack 2 which comprises the plurality of first electrically insulating layer structures 4 which are stacked one onto another, and which comprises the plurality of second electrically insulating layer structures 5 which are stacked one onto another. Thereby, the complex and highly dense component carrier 1 can efficiently be manufactured under low costs.

In another embodiment (not shown), at least some of the stacked copper filled laser vias 10, 11 can have a longitudinal axis which is shifted from a longitudinal axis of the interconnected vertical through connection 7. In another embodiment (not shown), longitudinal axes of interconnected, stacked copper filled laser vias 10, 11 can be shifted from each other in a staggered manner, in particular substantially in the same direction. For example, this can improve the stability of the component carrier by creating more stress reducing edges as well as by increasing a surface for heat spread. Advantageously, the staggering has the effect of increased stability and heat spread, while still keeping or establishing very dense lines and spaces and a low footprint.

Each of the first and second electrically insulating layer structures 4, 5 can be formed by a dielectric material. After having applied one electrically insulating layer structure 4, 5, a plurality of holes is drilled by laser drilling in that electrically insulating layer structure 4, 5. After that, the holes are fully or partially plated by an electrically or heat conductive material such as copper or aluminum so that the respective electrically insulating layer structure 4, 5 is patterned. These steps are repeated so that the stack 2 is formed having the array of stacked copper filled laser vias 10, 11.

Alternatively, instead of the laser vias 10, 11, the vertical through connections 7 can be contacted by direct contacting.

Contacts 13 of the component carrier 1 have a first pitch, and contacts 14 of the component 6 have a second pitch, wherein the first pitch is equal to the second pitch. Thus, the component carrier 1 may have a pitch of the same density of the component 6.

An active silicon layer 15 is arranged at the bottom main surface 8 of the component 6. As can be taken from the exemplary embodiment of FIG. 1, there are in total nine first vias 10 extending from the bottom main surface 8 of the component 6. At least one vertical through connection 7 is connected to seven first vias 10 by the active silicon layer 15. In general, a plurality of N first vias 10 is provided and the active silicon layer 15 connects at least one vertical through connection 7 to n vias 10, wherein n<N.

As can further be taken from the exemplary embodiment of FIG. 1, there are four vertical through connections 7. At least one of the first vias 10 is connected to three vertical through connections 7 by the active silicon layer 15. In general, a plurality of M vertical through connections 7 is provided and the active silicon layer 15 connects at least one via 10, 11 to m vertical through connections 7, wherein m<M.

Each vertical through connection 7 can be an inlay, in particular a copper or aluminum inlay or a copper or aluminum coin inlay. The inlay can be a heat pipe. The inlay is usually a solid body which has been prepared in advance. The prepared inlay is just inserted into a hole inside the component 6. Advantageously, a hot spot cooling of the component carrier 1 can be achieved by heat transfer from one main surface of the component carrier 1 to the other main surface of the component carrier 1.

The vertical through connections 7 can formed by etching, in particular by ion etching. Alternatively, the vertical through connections 7 can be formed by at least one of mechanical drilling and laser drilling. It is conceivable that the vertical through connections 7 and the first vias 10 and/or the second vias 11 are manufactured by the same technology, i.e. either be etching, laser drilling or mechanical drilling. Moreover, it is conceivable that the vertical through connections 7 and the first vias 10 and/or the second vias 11 are then manufactured in the same manufacturing step.

The following embodiments or modifications are possible:

At or on at least one of the two opposing main surfaces 8, 9 of the component 6, an electrically conductive bridge can be arranged which connects a contact 14 of the component 6 to a vertical through connection 7 which is not vertically aligned to that contact 14. The electrically conductive bridge may be a horizontal copper layer. Thereby, the density in the stack 2 can be modified.

At or on at least one of the two opposing main surfaces of the component carrier 1, an electrically conductive bridge can be arranged which connects a contact 13 of the component carrier 1 to a vertical through connection 7 which is not vertically aligned to that contact 13. The electrically conductive bridge may be a horizontal copper layer.

The vertical through connections 7 of the shown embodiment are fully plated or filled by an electrically or heat conductive material such as copper, aluminum, etc. In a modification, the vertical through connections can be plated by an electrically or heat conductive material without being completely filled. Thereby, the vertical through connections are hollow vertical through connections.

The component 6 may have active outputs (active contacts 14) which are arranged at only one of the two opposing main surfaces 8, 9 of the component 6. The signals from these outputs can be routed by the vertical through connections 7 to the other main surface of the two opposing main surfaces 8, 9 of the component 6.

In the shown embodiment, the vertical through connections 7 form together with the first and second vias 10, 11 through holes extending through the entire component carrier 1. In a modification, vertical through connections 7 can form together with at least one of the first and second vias 10, 11 a blind via or a buried via.

In the shown embodiment, the first pitch is substantially equal to the second pitch. In a modification, the array of stacked copper filled laser vias 10, 11 can form a redistribution layer in the stack 2.

In the shown embodiment, the vertical through connections 7 comprise a solid material such as copper. In a modification, the vertical through connections 7 can comprise or be a pasty material such as a paste or a gel.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a stack having at least one electrically conductive layer structure and/or at least one electrically insulating layer structure;
   a component embedded in the stack;
   an active silicon layer at least on one of the two opposing main surfaces of the component;
   a plurality of M vertical through connections extending between the two opposing main surfaces of and through the component;
   a plurality of N first vias in the at least one electrically insulating layer structure arranged adjacent to a first main surface of the two opposing main surfaces of the component;
   wherein each of the N first vias is aligned and connected to one of the vertical through connections;
   the component carrier further comprises at least one of the following:
   the active silicon layer connects at least one vertical through connection to n first vias, wherein n<N; and
   the active silicon layer connects at least one first via to m vertical through connections, wherein m<M.

2. The component carrier according to claim 1, wherein at least one of the vertical through connections is further connected to a second via in a second electrically insulating layer structure arranged adjacent to a second main surface of the component, the second main surface of the component being opposed to the first main surface of the component.

3. The component carrier according to claim 1, wherein contacts of the component carrier have a first pitch and contacts of the component have a second pitch, wherein the first pitch is substantially equal to the second pitch.

4. The component carrier according to claim 1, wherein at least one of the vertical through connections is connected at at least one of an upper end and a lower end by at least one copper filled laser via, in particular an array of stacked copper filled laser vias.

5. The component carrier according to claim 1, wherein the vertical through connection is an inlay.

6. The component carrier according to claim 1, wherein at least one vertical through connection is formed by etching, in particular by ion etching.

7. The component carrier according to claim 1, wherein the at least one vertical through connection is formed by at least one of mechanical drilling and laser drilling.

8. The component carrier according to claim 1, comprising at least one of the following features:
the component is at least one of a semiconductor component and a silicon chip;
the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electro-mechanical transducer, an actuator, a microelectromechanical system, a microprocessor, a capacitor, a resistor, an inductance, an accumulator, a switch, a camera, an antenna, a magnetic element, a further component carrier, and a logic chip;
wherein the at least one electrically conductive layer structure of the component carrier comprises at least one of the group consisting of copper, aluminum, nickel, silver, gold, palladium, and tungsten, any of the mentioned materials being optionally coated with supra-conductive material such as graphene;
wherein the at least one electrically insulating layer structure comprises at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;
wherein the component carrier is shaped as a plate;
wherein the component carrier is configured as one of the group consisting of a printed circuit board, a substrate, and an interposer;
wherein the component carrier is configured as a laminate-type component carrier.

9. A method of manufacturing a component carrier, comprising:
forming a stack having at least one electrically conductive layer structure and/or at least one electrically insulating layer structure;
embedding a component in the stack, wherein an active silicon layer is formed on at least one of two opposing main surfaces of the component;
forming a plurality of M vertical through connections extending between two opposing main surfaces of and through the component;
forming a plurality of N first vias in the at least one electrically insulating layer structure arranged adjacent to a first main surface of the two opposing main surfaces of the component, wherein each of the N first vias is aligned and connected to one of the M vertical through connections,
wherein the method comprises at least one of the following:
the active silicon layer connects at least one vertical through connection to n first vias, wherein n<N; and
the active silicon layer connects at least one first via to m vertical through connections, wherein m<M.

10. The method according to claim 9, further comprising:
forming a second via in a second electrically insulating layer structure arranged adjacent to a second main surface of the component, the second main surface of the component being opposed to the first main surface of the component, wherein the second via is connected to the at least one vertical through connection.

11. The method according to claim 9, further comprising at least one of the following features:
at least one of the vertical through connection is connected at at least one of an upper end and a lower end by at least one copper filled laser via, in particular an array of stacked copper filled laser vias;
the method further comprises arranging an inlay into the component to form the vertical through connection;
at least one vertical through connection is formed by etching, in particular by ion etching; and
the at least one vertical through connection is formed by at least one of mechanical drilling and laser drilling.

* * * * *